(12) United States Patent
Choi

(10) Patent No.: US 7,413,953 B2
(45) Date of Patent: Aug. 19, 2008

(54) METHOD OF FORMING FLOATING GATE ARRAY OF FLASH MEMORY DEVICE

(75) Inventor: Jong Woon Choi, Seoul (KR)

(73) Assignee: Dongbu Electronics Co., Ltd., Seoul (KR)

(*) Notice: Subject to any disclaimer, the term of this patent is extended or adjusted under 35 U.S.C. 154(b) by 0 days.

(21) Appl. No.: 11/641,034

(22) Filed: Dec. 19, 2006

(65) Prior Publication Data
US 2007/0141785 A1    Jun. 21, 2007

(30) Foreign Application Priority Data
Dec. 20, 2005    (KR) .................... 10-2005-0126037

(51) Int. Cl.
*H01L 21/336* (2006.01)
(52) U.S. Cl. .................. 438/257; 438/265; 257/315; 257/E21.682; 257/E27.103
(58) Field of Classification Search ............... 438/257, 438/264, 947, E21.68; 257/E29.129, 315
See application file for complete search history.

(56) References Cited
U.S. PATENT DOCUMENTS 5,328,810 A * 7/1994 Lowrey et al. .............. 430/313
6,063,688 A * 5/2000 Doyle et al. ................. 438/424
6,342,451 B1 * 1/2002 Ahn .......................... 438/706
6,893,972 B2 * 5/2005 Rottstegge et al. .......... 438/706
2006/0211260 A1 * 9/2006 Tran et al. ................... 438/763

* cited by examiner

*Primary Examiner*—Hsien Ming Lee
*Assistant Examiner*—Shaka Scarlett
(74) *Attorney, Agent, or Firm*—Lowe Hauptman Ham & Berner LLP

(57) ABSTRACT

The method of forming a floating gate array of a flash memory device includes: (a) sequentially forming a tunnel oxide film, a floating gate forming film, a capping oxide film and a first nitride film on a semiconductor substrate with an active device region defined by device isolation films; (b) patterning the first nitride film to form a first nitride film pattern; (c) forming first oxide film spacers on sidewalls of the first nitride film pattern; (d) selectively removing the first nitride film pattern; (e) forming a plurality of second nitride film patterns separated by the first oxide film spacers on the capping oxide film; (f) selectively removing the first oxide film spacers interposed between the plurality of second nitride film patterns and a portion of the capping oxide film to expose a surface of the floating gate forming film between the second nitride film patterns; (g) forming a plurality of floating gate patterns by removing a portion of the floating gate forming film exposed using the second nitride film patterns as an etching mask; and (h) oxidizing the sidewall of each of the plurality of floating gate patterns to form sidewall oxide films therebetween.

7 Claims, 4 Drawing Sheets

METHOD OF FORMING FLOATING GATE ARRAY OF FLASH MEMORY DEVICE

FIELD OF THE INVENTION

The present invention relates to a manufacturing technique of a semiconductor device, and more particularly to a method of forming floating gates of a flash memory device.

BACKGROUND OF THE INVENTION

A flash memory is a kind of PROM (Programmable ROM) possible for electrically re-writing data. The flash memory utilizes a single transistor made to perform both a program input function of an EPROM (Erasable PROM) and an erasing function of an EEPROM (Electrically Erasable PROM) by combining advantages of the EPROM, in which a memory cell is composed of a single transistor so that the area of the memory cell is small, and data can be collectively erased through ultraviolet radiation; and the EEPROM, in which data can be electrically erased, while a memory cell is composed of two transistors so that the area of the memory cell is larger. This type of flash memory is referred to as a Flash EEPROM.

Since memory information is not erased even though a power source is turned off, such a flash memory is referred to as a non-volatile memory, and it is different from DRAM (Dynamic RAM), SRAM (Static RAM) or the like in that it is non-volatile.

Flash memories may be classified into a NOR-type structure in which cells are arranged in parallel between a bit line and a ground and a NAND-type structure in which cells are arranged in series. A NOR-type flash memory with a parallel structure has been widely used for booting a cellular phone because a high-speed random access is possible when performing a reading operation, and a NAND-type flash memory with a serial structure has an advantage in that it is suitable for storing data and is profitable for miniaturization because a reading speed is slow but a writing speed is fast. Further, the flash memories may be classified into a stack gate type and a split gate type depending on the structure of a unit cell, and classified into a floating gate device and a SONOS (Silicon-Oxide-Nitride-Oxide-Silicon) device depending on the shape of an electric charge storage layer.

The floating gate device among these devices generally includes a floating gate made of polycrystalline silicon surrounded by an insulator, and an electric charge is injected into or discharged from the floating gate through channel hot carrier injection or Fowler-Nordheim tunneling so that storing and erasing data are accomplished.

FIG. 1 illustrates a sectional view of a semiconductor substrate with a floating gate array formed thereon in a process of manufacturing a flash memory device. The section of the substrate shown in FIG. 1 shows a vertical section parallel to a word line of the flash memory device. In the conventional flash memory device, a series of device isolation films 11, e.g., STIs (Shallow Trench Isolations), are formed in a direction perpendicular to the word line on the substrate 10 so as to define an active device region. Thereafter, a silicon oxide film 12 used as a tunnel oxide film is formed in a predetermined thickness on the entire surface of the substrate 10, and a polycrystalline silicon layer to be used as a floating gate is then formed on the silicon oxide film 12. The polycrystalline silicon layer formed in such a manner is patterned through photo and etching processes to form an array of a plurality of floating gates 14.

The respective plurality of floating gates 14 formed in such a manner constitute one memory cell in which the neighboring floating gates 14 are spaced apart from one another at an interval W. Since the floating gates 14 are generally patterned through photo and etching processes, it is not easy to reduce the interval W by any significant amount. Further, the method of manufacturing the conventional flash memory device is progressed through a process of first forming STIs on a substrate and then patterning floating gates through an additional photo process as described above, and a minimal alignment margin should be secured in order to prevent the misalignment of an etching mask in the process of forming the floating gates. Accordingly, since the interval of the floating gates needs to be maintained larger than a certain size, the integration of a device cannot be further reduced by relying upon the conventional method of manufacturing the flash memory. Further, since very expensive equipment needs be used in a case of the photo process, the manufacturing costs of the products is increased.

SUMMARY OF THE INVENTION

It is, therefore, an object of the present invention to provide a method of manufacturing a floating gate array of a highly integrated flash memory, which can remarkably reduce an interval between electrodes of floating gates while a minimal line width is not limited by a photo process.

In accordance with a preferred embodiment of the present invention, there is provided a method of forming a floating gate array of a flash memory device, comprising the steps of: (a) sequentially forming a tunnel oxide film, a floating gate forming film, a capping oxide film and a first nitride film on a semiconductor substrate with an active device region defined by device isolation films; (b) patterning the first nitride film to form a first nitride film pattern; (c) forming first oxide film spacers on sidewalls of the first nitride film pattern; (d) selectively removing the first nitride film pattern; (e) forming a plurality of second nitride film patterns separated by the first oxide film spacers on the capping oxide film; (f) selectively removing the first oxide film spacers interposed between the plurality of second nitride film patterns and a portion of the capping oxide film to expose a surface of the floating gate forming film between the second nitride film patterns; (g) forming a plurality of floating gate patterns by removing a portion of the floating gate forming film exposed using the second nitride film patterns as an etching mask; and (h) oxidizing the sidewall of each of the plurality of floating gate patterns to form sidewall oxide films therebetween.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Hereinafter, preferred embodiments of the present invention will be described in detail with reference to the accompanying drawings so that they can be readily implemented by those skilled in the art.

FIGS. 2 to 9 are sectional views illustrating a method of forming a floating gate array of a flash memory device in a process order according to the present invention. Herein, FIGS. 2 TO 9 show vertical sectional views parallel to a word line of the flash memory device.

Figure 2:
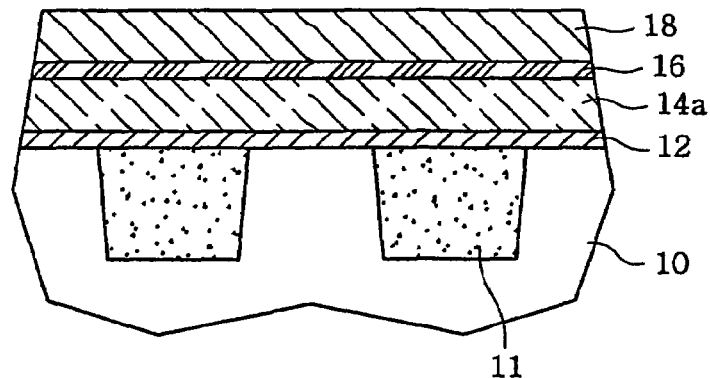
FIGS. 2 to 9 are sectional views illustrating a method of forming a floating gate array of a flash memory device in a process order according to the present invention.

First, referring to FIG. 2, a tunnel oxide film 12, a floating gate forming film 14a, a capping oxide film 16 and a first nitride film 18 are sequentially formed on a silicon semiconductor substrate 10 with device isolation films 11 defining an active device region, e.g., STIs. Here, it is preferred that the floating gate forming film 14a be made of polycrystalline silicon.

Figure 3:
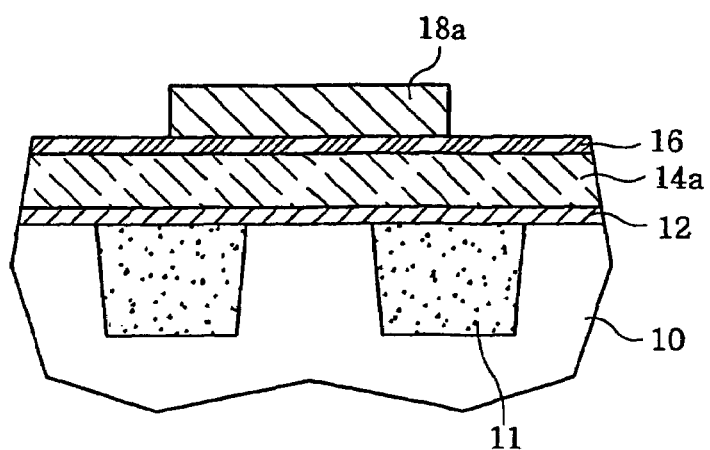

Next, the first nitride film 18 is patterned through photo and etching processes as shown in FIG. 3. A first nitride film pattern 18a formed in such a manner is formed on only one active device region among active device regions of two neighboring memory cells. In general, a flash memory cell array is composed of a plurality of cells arranged in a line while being insulated by device isolation films, and the first nitride film pattern 18a is formed on only one cell region among two neighboring cell regions. That is, cell regions on which the first nitride film pattern 18a is formed and not formed are alternately arranged.

Figure 4:
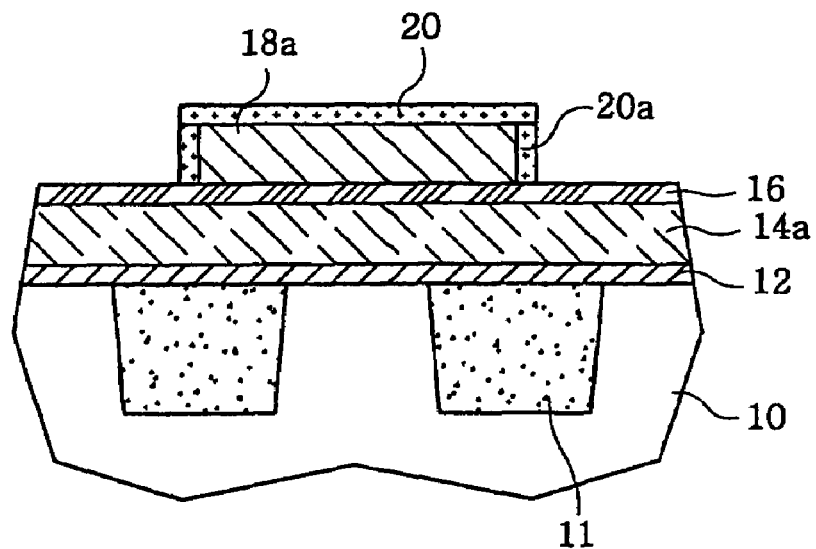
Figure 5:
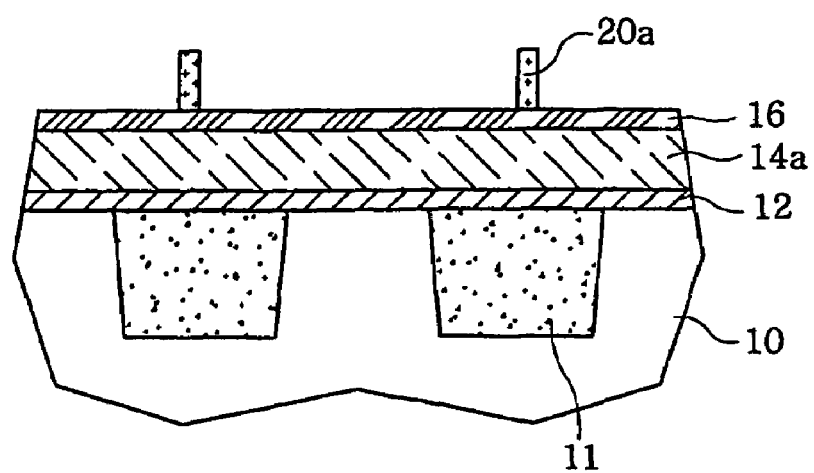

Next, oxide films 20 and 20a are deposited in an appropriate thickness on the entire surface of the substrate 10 as shown in FIG. 4. At this time, the oxide films 20 and 20a are formed on a top and sidewalls of the first nitride film pattern 18, respectively. Thereafter, by performing an anisotropic etching process on the entire surface of the substrate 10 without using a mask, only the first oxide film spacers 20a having been formed on the sidewalls of the first nitride film pattern 18a remains as shown in FIG. 5. The oxide film 20 and the first nitride film pattern 18a maybe simultaneously removed on the other regions except the first oxide film spacers 20a, and the first nitride film pattern 18a may be selectively removed through an additional process after the oxide film 20 has been removed.

Figure 6:
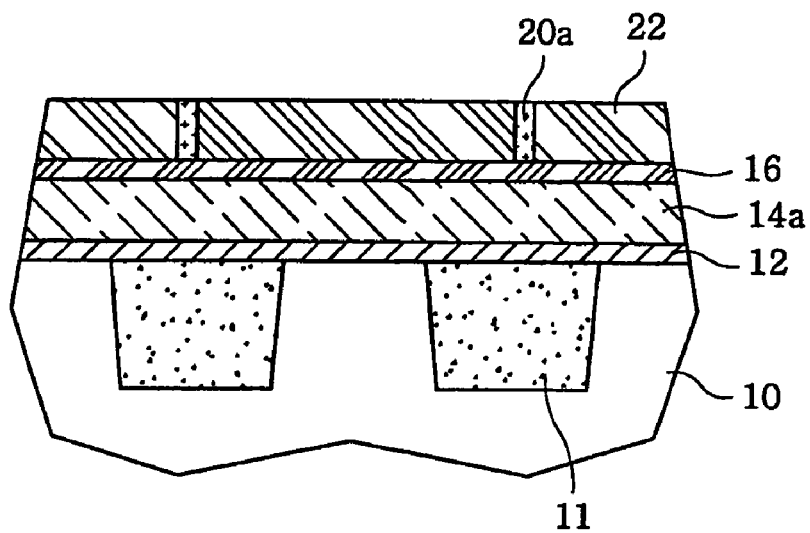

Next, a silicon nitride film is formed in a sufficient thickness on the capping oxide film 16 with a pair of the first oxide film 16 formed thereon, and a top of the silicon nitride film is then polished through a planarization process (e.g., chemical-mechanical polishing) until top ends of the first oxide film spacers 20a are exposed. Then, a plurality of second nitride film patterns 22 separated by the first oxide film spacers 20a are formed as shown in FIG. 6.

Figure 7:
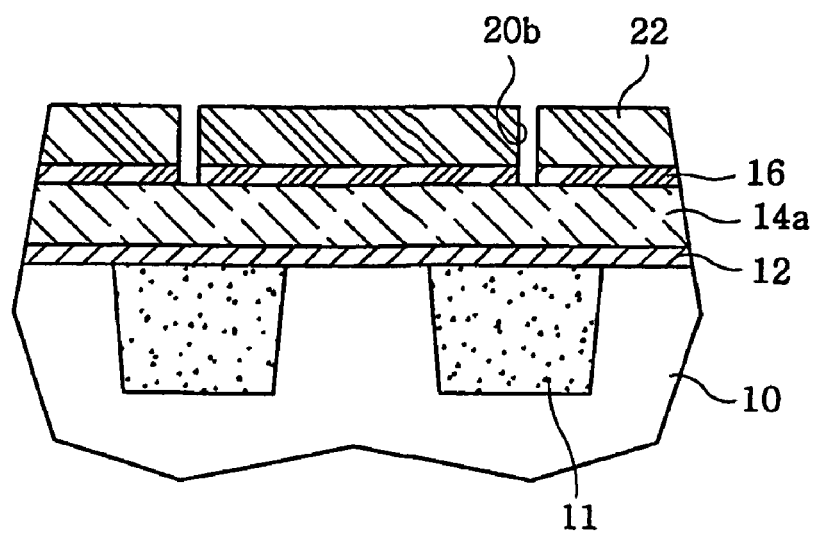

Next, there are selectively removed the first oxide film spacers 20a interposed between the plurality of second nitride film patterns 22 and a portion of the capping oxide film 12. In the selective oxide film removing process, a wet etchant with a high etching selection ratio with respect to silicon nitride film is used to completely remove the oxide film existing within a narrow crack between the second nitride film patterns 22. If the oxide film interposed between the second nitride film patterns 22 is removed in such a manner, a surface of the floating gate forming film 14a exposed through cracks 20b between the second nitride film patterns 22 as shown in FIG. 7.

Figure 8:
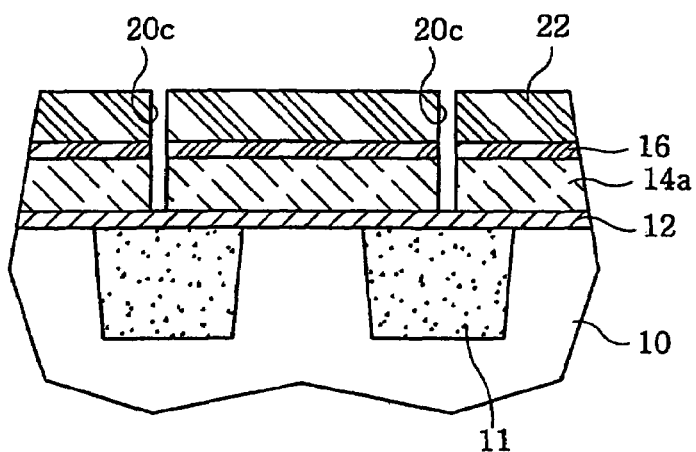

Next, a portion of the floating gate forming film 14a exposed through the cracks 20b is completely removed using the second nitride film patterns 22 as an etching mask as shown in FIG. 8. Accordingly, a plurality of floating gate patterns 14 constituting a unit cell are formed. At this time, deep, narrow trenches 20c are formed between the plurality of floating gate patterns 14, and the sidewalls of the plurality of floating gate patterns 14 are exposed through the trenches 20c.

Figure 9:
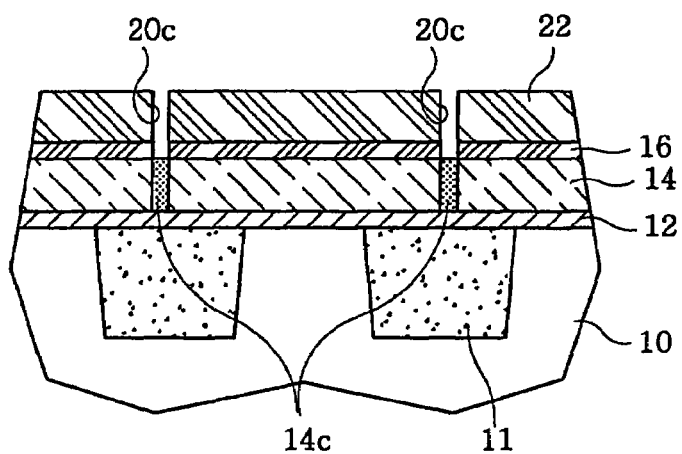

By oxidizing the sidewalls of the floating gate patterns 14 exposed in such a manner, sidewall oxide films 14c insulating the floating gate patterns 14 are formed therebetween as shown in FIG. 9. Preferably, the oxidization process is performed through a thermal oxidation process, in which the trenches 20c between the floating gate patterns 14 are filled with oxide films 14c formed through the oxidation process.

Figure 1:
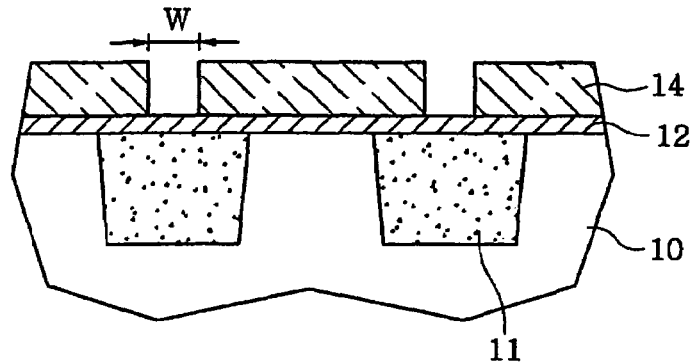
FIG. 1 is a sectional view showing a structure of a floating gate array of a conventional flash memory device.

The floating gate patterns 14 constituting the unit cell are insulated at a minimal interval through a series of processes shown in FIGS. 2 to 9, and the interval has a size much smaller than an interval (W in FIG. 1) formed through a general photo process.

Figure 10:
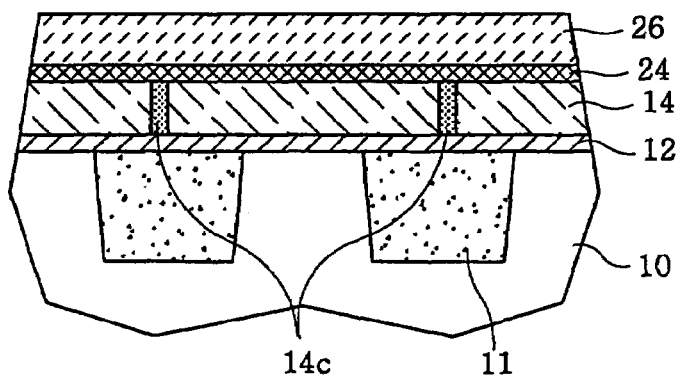
FIG. 10 is a sectional view of a flash memory device with a floating gate array, a dielectric film between gates and a control gate, which are formed through the method according to the present invention, laminated therein.

Subsequently, by selectively removing the second nitride film patterns 22 using a phosphoric acid solution with a high etching selection ratio with an oxide film, they can be removed while the side oxide films 14c formed below the second nitride film patterns 22 are not damaged. After the second nitride film patterns 22 have been removed, an ONO (Oxide-Nitride-Oxide) dielectric film 24 serving as a dielectric film between gates and a control gate 26 made of polycrystalline silicon are formed on the floating gate patterns 14 as shown in FIG. 10, so that the stack gate structure of a flash memory is completed.

According to the present invention, since an interval between floating gates of a flash memory device can be formed at a minimal width regardless of the minimum line width in accordance with a design rule, a highly integrated flash memory cell array can be formed. Particularly, a method of forming floating gates according to the present invention can be applied regardless of whether a cell structure is a NOR type or NAND type.

While the invention has been shown and described with respect to a limited number of embodiments, it will be understood by those skilled in the art that various changes and modifications may be made without departing from the spirit and scope of the invention as defined in the following claims.

What is claimed is:

1. A method of forming a floating gate array of a flash memory device, comprising the:
   (a) sequentially forming a tunnel oxide film, a floating gate forming film, a capping oxide film and a first nitride film on a semiconductor substrate with an active device region defined by device isolation films;
   (b) patterning the first nitride film to form a first nitride film pattern;
   (c) forming first oxide film spacers on sidewalls of the first nitride film pattern;
   (d) selectively removing the first nitride film pattern;
   (e) forming a plurality of second nitride film patterns separated by the first oxide film spacers on the capping oxide film;
   (f) selectively removing the first oxide film spacers interposed between the plurality of second nitride film patterns and a portion of the capping oxide film to expose a surface of the floating gate forming film between the second nitride film patterns;
   (g) forming a plurality of floating gate patterns by removing a portion of the floating gate forming film exposed using the second nitride film patterns as an etching mask; and (h) oxidizing the sidewall of each of the plurality of floating gate patterns to form sidewall oxide films therebetween; and wherein step (e) further comprises:

forming a second nitride film on the capping oxide film; and planarizing a top of the second nitride film until tops of the first oxide film spacers are exposed.

2. The method of claim 1, comprising: forming the floating gate forming film of a polycrystalline silicon film.

3. The method of claim 2, wherein the first nitride film pattern formed in the step (b) is formed on only one active device region among active device regions of two neighboring memory cells.

4. The method of claim 2, wherein the step (f) is performed using a wet etching process in which the first oxide film spacers and the capping oxide film can be selectively removed.

5. The method of claim 2, wherein the step (h) is performed using a thermal oxidation process.

6. The method of claim 2, further comprising removing the second nitride film patterns on tops of a plurality of floating gate patterns after the step (h).

7. The method of claim 6, wherein removing the second nitride film patterns is performed using a wet etching process.

* * * * *